United States Patent
MacGregor

(10) Patent No.: US 7,158,381 B2
(45) Date of Patent: Jan. 2, 2007

(54) HEAT SINK ASSEMBLY AND METHOD OF ATTACHING A HEAT SINK TO AN ELECTRONIC DEVICE ON A MOTHERBOARD

(75) Inventor: Mike G MacGregor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 10/607,783

(22) Filed: Jun. 27, 2003

(65) Prior Publication Data

US 2004/0264135 A1 Dec. 30, 2004

(51) Int. Cl.
*H05K 7/20* (2006.01)

(52) U.S. Cl. ..................... 361/709; 361/719

(58) Field of Classification Search ............... 361/704, 361/707, 709–721, 737, 753, 759; 257/718, 257/719, 727, 728
See application file for complete search history.

(56) References Cited

U.S. PATENT DOCUMENTS

| | | | | |
|---|---|---|---|---|
| 3,728,584 A | * | 4/1973 | Kuhlow | 361/712 |
| 4,266,267 A | * | 5/1981 | Ruegg | 361/717 |
| 4,321,423 A | * | 3/1982 | Johnson et al. | 174/16.3 |
| 4,546,408 A | * | 10/1985 | Rodseth et al. | 361/720 |
| 4,587,377 A | * | 5/1986 | Rodseth | 174/16.3 |
| 5,883,782 A | * | 3/1999 | Thurston et al. | 361/704 |
| 6,046,905 A | * | 4/2000 | Nelson et al. | 361/704 |
| 6,317,328 B1 | * | 11/2001 | Su | 361/704 |
| 6,549,410 B1 | * | 4/2003 | Cohen | 361/704 |
| 6,822,867 B1 | * | 11/2004 | Hsieh | 361/704 |
| 2004/0130876 A1 | * | 7/2004 | Davison | 361/719 |

* cited by examiner

*Primary Examiner*—Lisa Lea-Edmonds
*Assistant Examiner*—Corey Broussard
(74) *Attorney, Agent, or Firm*—Schwegman, Lundberg, Woessner & Kluth, P.A.

(57) ABSTRACT

A heat sink assembly is coupled to a motherboard and an electronic device on the motherboard. The heat sink assembly includes a heat sink with an opening extending through the heat sink, and a pin that extends through the motherboard and the opening in the heat sink to couple the heat sink to the electronic device and the motherboard. A member within the opening in the heat sink is positioned between the heat sink and the pin. A method of securing a heat sink to a motherboard and an electronic device on the motherboard includes thermally coupling a heat sink to an electronic device, securing the heat sink to a motherboard using a pin that extends through an opening in the heat sink, and positioning a member between the pin and the heat sink within the opening in the heat sink.

14 Claims, 1 Drawing Sheet

HEAT SINK ASSEMBLY AND METHOD OF ATTACHING A HEAT SINK TO AN ELECTRONIC DEVICE ON A MOTHERBOARD

TECHNICAL FIELD

This application is directed to a heat sink assembly and a method of attaching a heat sink to an electronic device on a motherboard, and more particularly to a heat sink assembly and method that use pins to couple a heat sink to a motherboard and an electronic device mounted on the motherboard.

BACKGROUND

Electronic devices generate heat during operation. Thermal management refers to the ability to keep temperature-sensitive elements in an electronic device within a prescribed operating temperature.

Historically, electronic devices have been cooled by natural convection. The cases or packaging of the devices included strategically located openings (e.g., slots) that allowed warm air to escape and cooler air to be drawn in.

The advent of high performance electronic devices, such as processors, now requires more innovative thermal management. Each increase in processing speed and power generally carries a "cost" of increased heat generation such that natural convection is no longer sufficient to provide proper thermal management.

One common method of cooling electronic devices includes thermally coupling a heat sink to the electronic device. A typical heat sink includes protrusions, such as fins or pins, which project from a body of the heat sink. The protrusions give the heat sink a larger surface area such that the heat sink dissipates a greater amount of thermal energy from the electronic device into the surrounding environment. Heat sinks are fabricated from materials with high thermal conductivity in order to efficiently transfer thermal energy from the electronic device.

Heat sinks are sometimes positioned against an electronic device and then attached to a system motherboard during a wave-soldering process that is typically part of motherboard manufacturing. As an example, heat sinks are commonly thermally coupled to some low-power electronic devices that are mounted on a motherboard in the vicinity of a CPU on the motherboard. The heat sinks are mounted to the motherboard by wave-soldering pins that extend through openings in the heat sink and throughholes in the motherboard.

One drawback with wave soldering pins to the motherboard is that, when the solder joints between the pins and the motherboard are subjected to temperature cycling stresses representative of accelerated use conditions, the solder joints become cracked, compromising the structural and thermal benefit of the heat sink. Temperature cycling stresses are generated on the solder joints because of the differences in the coefficients of thermal expansion between the materials that are used to manufacture heat sinks and motherboards.

As CPU power densities continue to increase, so too does the structural and thermal challenge related to designing platforms for the system manufacturing industry. High power CPU's are typically thermally coupled to a heat sink with a very large mass (450 grams or more). The heat sink that cools the CPU usually requires a large mass in order to meet the cooling requirements of the CPU. The large mass of the CPU heat sink generates unwanted shock and vibration stresses on any lower power electronic devices (e.g., graphics memory controller hub) that are mounted on the motherboard in the vicinity of the CPU and associated CPU heat sink. The shock and vibration stresses can be especially problematic when the motherboard is transported from one location to another.

One example relates to when a motherboard is mounted within a chassis that is shipped to an end user. The ball grid array (BGA) solder joints, which are often used to mount low-power electronic devices on the motherboard in the vicinity of the CPU, are particularly vulnerable to the shock and vibration forces generated by the high-mass CPU heat sink during shipping. Therefore, the heat sinks that are coupled to the low-power electronic devices on the motherboard are used to provide structural support to the BGA solder joints that connect the low-power electronic devices to the motherboard, and to provide thermal cooling to the low-power electronic devices.

There is a need for a heat sink assembly and method that securely couple a heat sink to a motherboard and to an electronic device mounted on the motherboard. The heat sink assemblies and methods should be able to partially absorb the shock, vibration and temperature cycling stresses that are typically generated on the solder joints within such assemblies.

DETAILED DESCRIPTION

The following detailed description of the invention references the accompanying drawings that show specific embodiments in which the invention may be practiced. Like numerals describe substantially similar components throughout each of the several views that make up the drawings. Other embodiments may be used, and structural, logical, and electrical changes made, without departing from the scope of the present invention.

The heat sink assembly, computer system and method described herein alleviate the stress that is typically generated between a heat sink and a pin that is used to mount the heat sink to a motherboard and an electronic device mounted on the motherboard. The temperature of the pin within the heat sink assembly is also maintained at a higher temperature when the pin is secured to the motherboard using a wave soldering process. The pin is maintained at a higher temperature because less heat is conducted out of the pin into the heat sink during the wave soldering process.

The higher temperature of the pin improves wetting of the liquid solder to the pin at the solder joint between the pin and the motherboard. Improving the wetting of the liquid solder to the pin forms an improved solder joint between the pin and the motherboard. The improved solder joint is more capable of absorbing the stress that is generated between the pin, heat sink and motherboard when the heat sink assembly is subjected to temperature cycling during operation of the electronic device 12.

Figure 1:
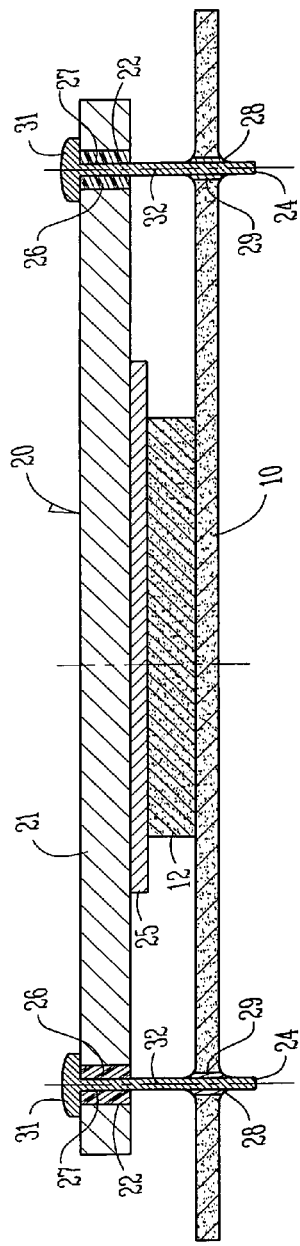
FIG. 1 is a section view of a heat sink assembly that is coupled to an electronic device and a motherboard.

FIG. 1 illustrates a heat sink assembly 20 that is coupled to an electronic device 12 and a motherboard 10. The heat sink assembly 20 includes a heat sink 21 with one or more openings 22 extending through the heat sink 21. The heat sink assembly 20 further includes one or more pins 24 that extend through the motherboard 10 and the openings 22 in the heat sink 21 to couple the heat sink 21 to the electronic device 12 and the motherboard 10. One or more members 26 are within at least one of the openings 22 in the heat sink 21 and are positioned between the heat sink 21 and the pins 24.

Heat sink 21 is preferably made from a material having good thermal conductivity (e.g., copper) such that heat sink 21 efficiently conducts thermal energy from electronic device 12 into the ambient air. In some forms, the heat sink 21 includes a base and protrusions extending from the base such that thermal energy is conducted from electronic device 12 through the base of heat sink 21 to the protrusions (base and protrusions not shown in this simplified view). The large surface area of the protrusions facilitates transferring the thermal energy from heat sink 21 to the surrounding environment.

Heat sink 21 can have any configuration because the design of heat sink 21 is determined by the thermal dissipation needs of electronic device 12 and the surrounding environment. In addition, a thermally conductive material 25, such as grease, soft metallic foil, or metal-impregnated paste, may be placed between electronic device 12 and heat sink 21 to minimize thermal resistance between heat sink 21 and electronic device 12.

In the illustrated sample embodiments, each member 26 is a bushing that is pressed within the openings 22 in heat sink 21. The bushings may include openings 27 such that pins 24 extend through the openings 27 in the bushings. In some forms, pins 24 are pressed through the openings 27 in each bushing.

It should be noted that member 26 may take forms other than the illustrated bushing and may be made from any material (e.g., plastic). In some embodiments, it may be desirable that member 26 is formed from a material which has (i) a lower thermal conductivity than the pin 24 and/or the heat sink 21; and/or (ii) a lower Modulus of Elasticity than the pin 24 and/or the heat sink 21.

When the material of member 26 has a lower thermal conductivity than pin 24 and/or heat sink 21, member 26 inhibits the flow of heat from pin 24 to heat sink 21 during wave soldering processes that may be used to connect pin 24 to motherboard 10. Inhibiting the flow of heat from pin 24 during a wave soldering process maintains pin 24 at a higher temperature when pin 24 is secured to motherboard 10. The higher temperature of pin 24 improves wetting of the solder 28 to pin 24 at the solder joint 29 between pin 24 and motherboard 10.

When the material of member 26 has a lower Modulus of Elasticity than pin 24 and/or heat sink 21, member 26 partially absorbs the shock, vibration and temperature cycling stresses that are generated on the solder joint 29 between pin 24 and motherboard 10. Absorbing the shock, vibration and temperature cycling stresses is especially important because the electronic device 12 may be mounted on motherboard 10 using a BGA solder joint that can be vulnerable to shock, vibration and thermal cycling stresses.

The illustrated example pins 24 each include a head 31 and a body 32 that is attached to head 31. The head 31 of each pin 24 is larger than the openings 22 in heat sink 21 such that the head 31 of each pin 24 engages heat sink 21. In some forms, the body 32 of each pin 24 and the openings 22 in heat sink 21 are cylindrical, and/or concentric with the openings 22 in heat sink 21. It should be noted that the body 32 of each pin 24, and the openings 22 in heat sink 21, may be other shapes besides cylindrical.

Heat sink assembly 20 may include any number, size and style of pins 24 that are adapted to secure heat sink 21 to motherboard 10 and electronic device 12. The arrangement, location, number and type of pins 24 and openings 22 in heat sink 21 will often depend on such factors as the type of heat sink, the space available for the heat sink assembly, cost and the cooling requirements of the heat sink assembly (among other factors).

A method of securing a heat sink 21 to an electronic device 12 and a motherboard 10 will now be described with reference to FIG. 1. The method includes thermally coupling heat sink 21 to electronic device 12, and securing heat sink 21 to motherboard 10 using a pin 24 that extends through an opening 22 in heat sink 21. The method further includes positioning a member 26 between pin 24 and heat sink 21 within the opening 22 in heat sink 21.

Positioning member 26 between pin 24 and heat sink 21 within the opening 22 in heat sink 21 may include (i) pressing a bushing into the opening 22 in heat sink 21; and/or (ii) pressing pin 24 through an opening 27 in the bushing. In addition, positioning member 26 between pin 24 and heat sink 21 within the opening 22 in heat sink 21 may include at least partially positioning member 26 within the opening 22 in heat sink 21, or positioning the entire member 26 within the opening 22 in heat sink 21.

The method may further include wave soldering pin 24 to motherboard 10 such that a solder joint 29 is formed between pin 24 and motherboard 10. Member 26 may be more elastic than pin 24 and heat sink 21 such that member 26 alleviates stress between pin 24, heat sink 21 and motherboard 10, especially in solder joint 29.

Once pin 24 is wave soldered to motherboard 10, the head 31 on pin 24 may apply a compressive force to heat sink 21. The compressive force would serve to secure the heat sink 21 against electronic device 12, especially when heat sink assembly 20 is subjected to shock and/or vibration loading. In addition, the compressive force would reduce the thermal resistance between heat sink 21 and electronic device 12.

Figure 2:
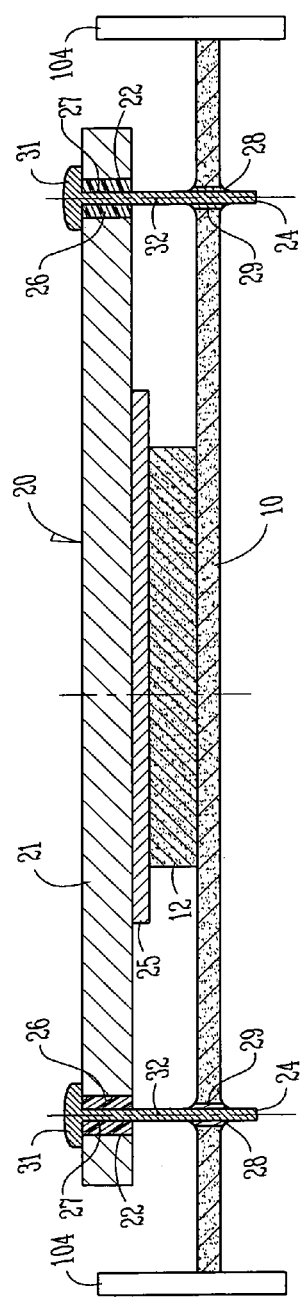
FIG. 2 is a section view of a computer system that includes the heat sink assembly shown in FIG. 1.

FIG. 2 illustrates a computer system 100 that includes heat sink assembly 20. It should be noted that heat sink assembly 20 might be incorporated into any type of computer system. In the illustrated example embodiment, computer system 100 includes a motherboard 10 and an electronic device 12 coupled to the motherboard 10. The computer system 100 further includes a heat sink 21 having an opening 22 and a pin 24 extending through the motherboard 10 and the opening 22 in heat sink 21. Pin 24 couples heat sink 21 to electronic device 12 and motherboard 10. A member 26 is at least partially within the opening 22 in heat sink 21 and is between heat sink 21 and pin 24.

As discussed above with regard to FIG. 1, member 26 may be made from any material or combination of materials, including materials that have (i) a lower thermal conductivity than pin 24 and/or heat sink 21; and/or (ii) a lower Modulus of Elasticity than pin 24 and/or heat sink 21

In the example embodiment illustrated in FIG. 2, computer system 100 includes a chassis 104 such that the motherboard 10 is mounted to the chassis 104. Motherboard 10 may be attached to chassis 104 using any known technique.

In some sample embodiments, heat sink 21 is thermally coupled to a low-power electronic device 12 (e.g., a graphics memory controller hub) that is mounted on the motherboard 10 in the vicinity of a high-powered CPU (not shown), which is also mounted on the motherboard 10. The low-power electronic device 12 may be coupled to the motherboard 10 via a BGA solder joint that is structurally supported by heat sink 21. The high-powered CPU may include its own large-mass heat sink (not shown), which is necessary to meet the cooling requirements of the CPU.

The low-power electronic device 12 may be mounted on the motherboard 10 using a BGA solder joint. The BGA solder joint is less vulnerable to shock and vibration stresses, such as the stresses generated by the CPU's high-mass heat sink during shipping, when member 26 has a lower Modulus of Elasticity than pin 24 and heat sink 21. The member 26 also partially alleviates the temperature cycling stresses that are generated on the solder joint 29 during operation of the computer system 100.

The heat sink assembly, computer system and method described above securely couple a heat sink to a motherboard and an electronic device mounted on the motherboard. The heat sink assembly, computer system and method alleviate some of the shock, vibration and temperature cycling stresses that are typically generated on the solder joints within such assemblies.

Many other embodiments will be apparent to those of skill in the art from the above description. The scope of the invention should be determined with reference to the appended claims, along with the full scope of equivalents to which such claims are entitled.

What is claimed is:

1. An electronic assembly comprising:
   a heat sink that includes an upper surface and a lower surface and an opening extending between the upper and lower surfaces of the heat sink;
   a motherboard;
   an electronic device between the motherboard and the lower surface of the heat sink;
   a pin that contacts the upper surface of the heat sink, the pin extending through the opening in the heat sink and the motherboard to couple the heat sink to the electronic device and the motherboard; and
   a member within the opening in the heat sink, the member being between the heat sink and the pin, the member including an upper surface that is substantially planer with the upper surface of the heat sink and a lower surface that is substantially planer with the lower surface of the heat sink.

2. The electronic assembly of claim 1, wherein the member is a bushing that is pressed into the opening in the heat sink.

3. The electronic assembly of claim 2, wherein the pin is pressed through an opening in the bushing.

4. The electronic assembly of claim 1, wherein the member is plastic.

5. The electronic assembly of claim 1, wherein the pin includes a head that is larger than the opening in the heat sink, the head of the pin contacting the upper surface of the heat sink.

6. The electronic assembly of claim 1, further comprising a thermally conductive material between the heat sink and the electronic device.

7. A method comprising:
   attaching an electronic device to a motherboard;
   thermally coupling a heat sink to the electronic device such that the electronic device is between a lower surface of the heat sink and the motherboard;
   positioning a member within an opening in the heat sink such that a lower surface of the member is substantially planer with the lower surface of the heat sink and an upper surface of the member is substantially planer with an upper surface of the heat sink;
   inserting a pin through the opening in the heat sink and the motherboard such that the pin contacts an upper surface of the heat sink and the member is between the pin and the heat sink; and
   securing the pin to the motherboard.

8. The method of claim 7, wherein securing the pin to the motherboard includes wave soldering the pin to the motherboard.

9. The method of claim 7, wherein positioning a member within the opening in the heat sink includes pressing a bushing into the opening in the heat sink.

10. The method of claim 7, wherein positioning a member within the opening in the heat sink includes positioning the entire member within the opening in the heat sink.

11. The method of claim 7, wherein positioning a member within the opening in the heat sink includes placing a member that is more elastic than the pin and the heat sink between the pin and the heat sink to alleviate stress between the pin and heat sink.

12. A computer system comprising:
    a heat sink that includes an upper surface and a lower surface and an opening extending between the upper and lower surfaces of the heat sink;
    a motherboard;
    an electronic device between the motherboard and the lower surface of the heat sink;
    a pin that contacts the upper surface of the heat sink, the pin extending through the opening in the heat sink and the motherboard to couple the heat sink to the electronic device and the motherboard;
    a member within the opening in the heat sink, the member being between the heat sink and the pin, the member including an upper surface that is substantially planer with the upper surface of the heat sink and a lower surface that is substantially planer with the lower surface of the heat sink; and
    a chassis, the motherboard being attached to the chassis.

13. The computer system of claim 12, wherein the member is a bushing that is pressed into the opening in the heat sink.

14. The computer system of claim 12, wherein the pin is soldered to the motherboard.

* * * * *